United States Patent
Nakamata et al.

(10) Patent No.: US 10,597,526 B2
(45) Date of Patent: Mar. 24, 2020

(54) RESIN COMPOSITION

(71) Applicant: Fuji Electric Co., Ltd., Kawasaki-shi, Kanagawa (JP)

(72) Inventors: Yuko Nakamata, Kawasaki (JP); Yuji Ichimura, Kawasaki (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 15/445,385

(22) Filed: Feb. 28, 2017

(65) Prior Publication Data

US 2017/0275453 A1    Sep. 28, 2017

(30) Foreign Application Priority Data

Mar. 22, 2016 (JP) ................. 2016-056429

(51) Int. Cl.
*C08L 63/00* (2006.01)
*H01L 23/29* (2006.01)
(Continued)

(52) U.S. Cl.
CPC ............ *C08L 63/00* (2013.01); *C08G 59/226* (2013.01); *C08G 59/4215* (2013.01); *H01L 23/293* (2013.01); *H01L 23/295* (2013.01); *H01L 23/3114* (2013.01); *H01L 24/48* (2013.01); *H01L 24/69* (2013.01); *H01L 29/16* (2013.01); *H01L 29/1608* (2013.01); *H01L 29/2003* (2013.01); *C08L 2201/08* (2013.01); *C08L 2203/206* (2013.01); *H01L 23/24* (2013.01); *H01L 24/40* (2013.01); *H01L 2224/32225* (2013.01); *H01L 2224/40225* (2013.01);
(Continued)

(58) Field of Classification Search
CPC ............ H01L 23/295; H01L 23/02–10; H01L 23/16–26; H01L 25/04–13; H01L 25/165; H01L 21/52–54; H01L 21/4817; H01L 21/4803–481; C08L 63/00
See application file for complete search history.

(56) References Cited

U.S. PATENT DOCUMENTS

| | | | | |
|---|---|---|---|---|
| 4,001,368 A | * | 1/1977 | Michizoe | ............ B29C 47/0004 264/209.6 |
| 4,210,733 A | * | 7/1980 | Hayashi | ................. C08G 61/02 525/109 |

(Continued)

FOREIGN PATENT DOCUMENTS

| | | |
|---|---|---|
| JP | S63000347 A | 1/1988 |
| JP | H05170876 A | 7/1993 |

(Continued)

OTHER PUBLICATIONS

Japanese Office Action for Application No. JP 2016056429 dated Dec. 20, 2019, 6 pages.

*Primary Examiner* — Tucker J Wright
(74) *Attorney, Agent, or Firm* — Lerner, David, Littenberg, Krumholz & Mentlik, LLP

(57) ABSTRACT

A resin composition is disclosed that includes a thermosetting base resin; a curing agent; an inorganic filler; and at least one fluorine resin powder selected from polyvinylidene fluoride, polychlorotrifluoroethylene, and a tetrafluoroethylene/perfluoro(alkyl vinyl ether)/chlorotrifluoroethylene copolymer, and a semiconductor device which is fabricated by being sealed using a sealant formed of the resin composition.

9 Claims, 2 Drawing Sheets

(51) Int. Cl.
*C08G 59/22* (2006.01)
*C08G 59/42* (2006.01)
*H01L 23/31* (2006.01)
*H01L 23/00* (2006.01)
*H01L 29/16* (2006.01)
*H01L 29/20* (2006.01)
*H01L 23/24* (2006.01)

(52) U.S. Cl.
CPC ............... *H01L 2224/45124* (2013.01); *H01L 2224/45147* (2013.01); *H01L 2224/48091* (2013.01); *H01L 2224/48225* (2013.01); *H01L 2224/48227* (2013.01); *H01L 2224/48472* (2013.01); *H01L 2224/69* (2013.01); *H01L 2224/73265* (2013.01); *H01L 2924/00014* (2013.01); *H01L 2924/1033* (2013.01); *H01L 2924/10253* (2013.01); *H01L 2924/10272* (2013.01); *H01L 2924/13055* (2013.01); *H01L 2924/181* (2013.01)

(56) References Cited

U.S. PATENT DOCUMENTS

| | | | | |
|---|---|---|---|---|
| 2003/0024723 | A1* | 2/2003 | Igarashi | C08G 59/08 174/521 |
| 2004/0042186 | A1* | 3/2004 | Furukawa | H01L 24/97 361/760 |
| 2010/0013095 | A1* | 1/2010 | Hada | H01L 23/49811 257/741 |
| 2011/0317382 | A1 | 12/2011 | Cho et al. | |
| 2014/0273686 | A1* | 9/2014 | Eguchi | C08J 5/24 442/64 |
| 2014/0291287 | A1* | 10/2014 | Stockum | H01L 31/1888 216/42 |
| 2014/0346676 | A1* | 11/2014 | Horio | H01L 25/18 257/773 |
| 2015/0166847 | A1* | 6/2015 | Morita | H01L 33/46 257/98 |
| 2017/0098551 | A1* | 4/2017 | Nakamura | H01L 21/481 |

FOREIGN PATENT DOCUMENTS

| | | |
|---|---|---|
| JP | 2000516983 A | 12/2000 |
| JP | 2001253999 A | 9/2001 |
| JP | 2008106106 A | 5/2008 |
| JP | 20127150 A | 1/2012 |
| JP | 2013014663 A | 1/2013 |
| JP | 2013127022 A | 6/2013 |
| JP | 2015078758 A | 4/2015 |
| WO | 9808906 A1 | 3/1998 |

* cited by examiner

RESIN COMPOSITION

CROSS-REFERENCE TO RELATED APPLICATION

This application claims priority from Japanese Patent Application No. 2016-056429, filed on Mar. 22, 2016, the disclosure of which is hereby incorporated by reference.

TECHNICAL FIELD

The present invention relates to a resin composition. The present invention particularly relates to a resin composition which has high oxidation resistance used as a sealant for a semiconductor device.

BACKGROUND

Power modules, especially insulated-gate bipolar transistors (IGBTs), have begun to be widely used in electric power conversion devices in recent years. A power module has at least one built-in power semiconductor device and constitutes part or the entirety of a conversion connection. In addition, the power module has a structure in which the power semiconductor is electrically insulated from the base plate or the cooling surface.

An epoxy resin is used in general as a sealant for forming an electrically insulating structure. The epoxy sealing resin is suitable as a sealant because of its high dimensional stability, water resistance and chemical resistance, and electrical insulation property.

As next-generation semiconductors such as silicon carbide (SiC) have been put to practical use, semiconductor chips with higher withstand voltage have been developed. For example, conventional silicon (Si) chips have a withstand voltage of approximately 1200 V, while SiC chips have a withstand voltage ranging from 3300 V to 13 kV. A SiC chip has a high withstand voltage, and moreover is used in high temperature environments. For these reasons, a sealant using a conventional epoxy resin has problems of cracks and peeling between the resin and the metal members. In order to achieve high heat resistance, a technique is known which uses, as a sealant, a resin formed by mixing a maleimide resin being a high-heat-resistant resin and an epoxy resin. Also, a sealant is known which contains a polytetrafluoroethylene (PTFE) nanofiller in order to achieve high heat resistance and low moisture absorption.

It has become known that one cause of cracks and peeling is oxidation of a sealing resin. When a sealing resin oxidizes and deteriorates, some of the bonds in the resin polymer may be cleaved, which sometimes results in cracks and peeling in the resin and near the interface between the resin and the metal members.

Currently, companies add color to sealing resins in some cases in order to add features. In this case, molding is performed using a sealing resin which contains a coloring agent. In a power module, color fading or chalking occurs due to oxidation caused by a high temperature application test before delivery or deterioration by electrical conduction after delivery. Also, it is known that these phenomena proceed from the outer side to the inner side of the module.

In light of these circumstances, a resin in which oxidation deterioration is suppressed is demanded.

BRIEF SUMMARY

The present inventors found that addition of powder of a specific fluorine resin to a thermosetting resin makes it possible to improve oxidation resistance, give satisfactory heat resistance, and inhibit color fading, which has led to the completion of the present invention. One aspect of the disclosure provides a resin composition including: a thermosetting base resin; a curing agent; an inorganic filler; and at least one fluorine resin powder selected from polyvinylidene fluoride, polychlorotrifluoroethylene, and a tetrafluoroethylene/perfluoro(alkyl vinyl ether)/chlorotrifluoroethylene copolymer.

In one implementation, an average particle diameter of the fluorine resin powder is 10 to 200 μm. In another implementation, a content of the fluorine resin powder is more than 1% by mass and less than 50% by mass when a total mass of the thermosetting base resin, the curing agent, the inorganic filler, and the fluorine resin powder is regarded as 100%. In another implementation, the thermosetting base resin is an epoxy resin. In another implementation, the curing agent is an acid anhydride-based curing agent. In another implementation, the resin composition is used for sealing electronic equipment.

Yet another aspect of the disclosure provides a semiconductor device in which a semiconductor element and an output terminal mounted on a laminated substrate are connected together using a conductive connection member, and are sealed by a sealant. At least part of an outer peripheral portion of the sealant contains any of the resin compositions described above.

In one implementation, the at least part of the outer peripheral portion is a portion with a thickness of 1.0 to 2.0 mm from an outer peripheral surface. In another implementation, the thermosetting base resin is a mixture of an alicyclic epoxy resin and a bisphenol A epoxy resin. In another implementation, the conductive connection member includes one or more a wire, a pin, or a lead frame. In another implementation, the semiconductor element includes one or more of a Si semiconductor element, a SiC semiconductor element, or a GaN semiconductor element.

Some implementations provide a resin composition which has excellent oxidation resistance and color fading inhibition characteristics, and is suitable for a member constituting the outer peripheral portion of a sealant for electronic equipment. Moreover, a semiconductor device fabricated using the resin composition as a sealant can be provided as a power module product which has good heat resistance and external appearance, and a feature added by coloring the sealant.

DETAILED DESCRIPTION

Figure 1:
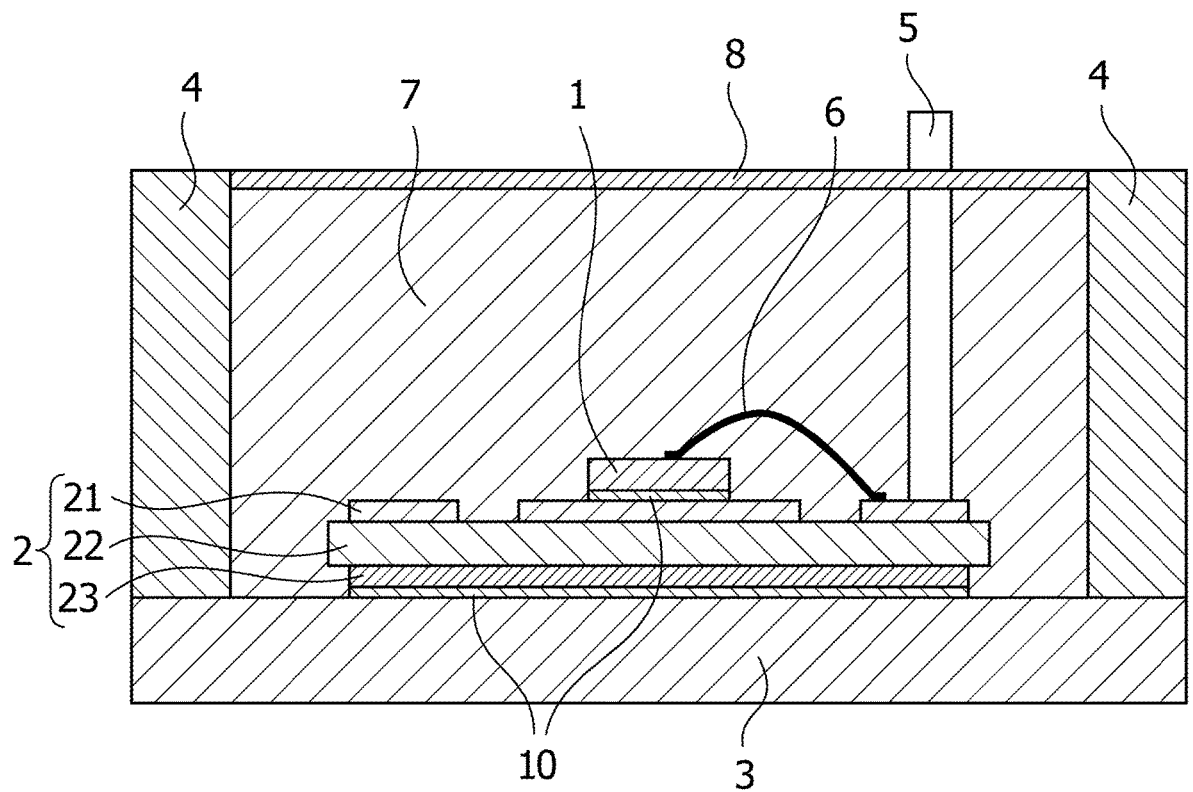
FIG. 1 is a conceptual diagram illustrating a cross-sectional structure of a power module, which is an example of a semiconductor device according to the present invention.

Hereinbelow, embodiments of the present invention are described with reference to the drawings. Note that the present invention is not limited to the embodiments to be described below. For example, the relative dimensions and positions between the members illustrated in the drawings do not limit the present invention.

First Embodiment: Resin Composition

A first embodiment according to the present invention is a resin composition. The resin composition includes a thermosetting base resin, a curing agent, an inorganic filler, and at least one fluorine resin powder selected from polyvinylidene fluoride, polychlorotrifluoroethylene, and a tetrafluoroethylene/perfluoro(alkyl vinyl ether)/chlorotrifluoroethylene copolymer.

The thermosetting base resin used in the embodiment is not particularly limited, and includes, for example, an epoxy resin, a phenolic resin, a maleimide resin, and the like. For the electronic component, an epoxy resin having at least two epoxy groups in one molecule is particularly preferable because of its high dimensional stability, water resistance, chemical resistance, and electrical insulation property. Specifically, examples of such epoxy resin include, but are not limited to, a bisphenol A epoxy resin, a bisphenol F epoxy resin, a bisphenol E epoxy resin, a bisphenol S epoxy resin, a bisphenol AD epoxy resin, a naphthalene type epoxy resin, a phenol novolac type epoxy resin, a cresol novolac type epoxy resin, a maleimide naphthol resin, a maleimide triazine resin, a maleimide resin, a glycidyl ester type epoxy resin, a glycidyl amine type epoxy resin, and like. These thermosetting base resins may be used alone or in combination of two or more. It is possible to adjust as appropriate physical properties such as the heat resistance, toughness, and flame retardancy by the combination of monomer molecules to be copolymerized.

A reactive diluent having a cross-linkable functional group such as an epoxy group at a terminal may be mixed as appropriate to the thermosetting base resin as an optional component in order to adjust viscosity and cross-linking density. Examples of the reactive diluent include, but are not limited to, phenyl glycidyl ether, 2-ethylhexyl glycidyl ether, n-butyl glycidyl ether, cresyl glycidyl ether, p-s-butylphenyl glycidyl ether, allyl glycidyl ether, α-pinene oxide, styrene oxide, glycidyl methacrylate, and 1-vinyl-3, 4-epoxycyclohexane. The amount of the reactive diluent added may be determined as appropriate by one skilled in the art depending on the properties and the like of the thermosetting base resin.

Although the curing agent used in the embodiment is not particularly limited as long as the curing agent is capable of reacting with the thermosetting base resin and curing, it is preferable to use an acid anhydride-based curing agent. The acid anhydride-based curing agent includes, for example, an aromatic acid anhydride, or specifically, a phthalic anhydride, a pyromellitic anhydride, a trimellitic anhydride, and the like. Alternatively, the acid anhydride-based curing agent includes a cycloaliphatic acid anhydride, or specifically tetrahydrophthalic anhydride, methyltetrahydrophthalic anhydride, hexahydrophthalic anhydride, methylhexahydrophthalic anhydride, methyl nadic anhydride, and the like, and, an aliphatic acid anhydride, or specifically succinic anhydride, poly (adipic anhydride), poly (sebacic anhydride), poly (azelaic anhydride), and the like. The amount of curing agent blended is preferably 50 to 170 parts by mass, and more preferably 80 to 150 pars by mass relative to 100 parts by mass of the thermosetting base resin. If the amount of curing agent blended is less than 50 parts by mass, the glass transition temperature may decrease due to the shortage of cross-links, and if the amount of curing agent blended is greater than 170 parts by mass, the moisture resistance, the high thermal deformation temperature, and the heat resistance stability may deteriorate.

What is more, a curing accelerator may be added to the resin composition as an optional component. As the curing accelerator, imidazole or a derivative thereof, tertiary amine, boric acid ester, a Lewis acid, an organometallic compound, an organic acid metal salt, and the like may be blended as appropriate. The amount of curing accelerator added is preferably 0.01 to 50 parts by mass, and more preferably 0.1 to 20 parts by mass relative to 100 parts by mass of the thermosetting base resin.

A fluorine resin powder is a fluorine resin in a powdered state at normal temperature and pressure. The fluorine resin used in the embodiment includes polyvinylidene fluoride (PVDF), polychlorotrifluoroethylene (PCTFE), and a tetrafluoroethylene/perfluoro(alkyl vinyl ether)/chlorotrifluoroethylene copolymer (CPT). The fluorine resin used may be one selected from the above, or be a mixture of two or more of the above. Each of these fluorine resins is preferable in terms of high heat resistance, low oxygen permeability, transparency, and high flame retardancy. Note that the fluorine resin may be mixed with other components as long as it contains these as the main components.

The shape of the fluorine resin powder is not particularly limited and may be sphere-shaped, needle-shaped, foil-shaped, fiber-shaped, or the like. In particular, a spherical particle is preferable. In addition, the average particle diameter is preferably approximately 10 to 200 μm, and more preferably approximately 15 to 50 μm, but is not limited to these ranges. When the average particle diameter is below these ranges, it may be difficult to handle the fluorine resin due to, for example, the dispersion thereof. The above ranges are preferable because when the average particle diameter is within these ranges, it is possible to ensure favorable dispersibility. Note that in the present specification, the average particle diameter refers to a value measured by a laser diffraction method. Powdered resins commercially available can be used for these fluorine resin powders. Alternatively, the fluorine resin powder used may be obtained by reducing a fluorine resin cured product to powder by a mill or the like, and separating the fluorine resin powder with a desired particle diameter.

The fluorine resin powder contained is preferably more than 1% by mass and less than 50% by mass, and more preferably 5 to 30% by mass when the total mass of the thermosetting base resin, the curing agent, the inorganic filler, and the fluorine resin powder is regarded as 100%. This is because, in the case the content of the fluorine resin powder is 1% by mass or less, a sufficient oxidation inhibition effect and color fading property inhibition effect may not be obtained, and additionally, in the case in which the content of the fluorine resin powder is more than 50% by mass, increased thickness may deteriorate workability.

Examples of the used inorganic filler added to the resin component include, but are not limited to, fused silica, silica, alumina, aluminum hydroxide, titania, zirconia, aluminum nitride, talc, clay, mica, glass fiber, and the like. These inorganic fillers make it possible to enhance the thermal conductivity of the cured product and to reduce the coefficient of thermal expansion of the cured product. These inorganic fillers may be used alone or in mixture of two or more. In addition, these inorganic fillers may be a microfiller or may be a nanofiller, or alternatively two or more inorganic fillers having different particle diameters or of different kinds may be used in mixture. In particular, it is preferable to use an inorganic filler with an average particle diameter of approximately 0.2 to 20 μm. The amount of inorganic filler added is preferably 100 to 600 parts by mass and more preferably 200 to 400 parts by mass when the total mass of the thermosetting base resin and the curing agent is set to 100 parts by mass. If the amount of inorganic filler blended is less than 100 parts by mass, the possibility of peelings and cracks increases in some cases due to the increase in the coefficient of thermal expansion of the sealant. If the amount blended is greater than 600 parts by mass, the viscosity of the composition may increase, leading to the deterioration of extrusion moldability.

In a case in which the resin composition of the present invention is used as a resin for a sealant of a semiconductor device, the resin composition may contain any optional additive as long as the characteristics thereof are not deteriorated. Examples of the additive include, but are not limited to, a pigment for coloring a resin, a flame retardant, a plasticizer for enhancing crack resistance, and a silicone elastomer. These optional components and the addition amounts thereof may be determined as appropriate by one skilled in the art depending on the specifications of the semiconductor device. In particular, since a resin composition of the embodiment is capable of inhibiting the color fading of the cured resin itself, a resin composition containing a coloring pigment is unlikely to change in color due to resin deterioration, and thus, it can retain the original color of the pigment.

The method of preparing the resin composition according to the embodiment makes it possible to prepare the resin composition by mixing together the components described above in an ordinary method, and preferably dispersing the fluorine resin powder in the resin composition in a substantially uniform manner.

The resin composition according to the first embodiment of the present invention can provide a cured resin product having excellent oxidation resistance and heat resistance. Hence, the resin composition can be used favorably for sealing an electronic component, in particular for sealing a semiconductor.

Second Embodiment: Semiconductor Device

An embodiment according to the present invention is a semiconductor device which is fabricated by connecting a semiconductor element and an output terminal mounted on a layered substrate together using a conductive connection member, and sealing the components using a sealant. Besides, at least part of an outer peripheral portion of the sealant is formed of the resin composition described in the first embodiment.

FIG. 1 is a conceptual cross-sectional diagram of a power module, which is an example of a semiconductor device according to the present invention. The semiconductor element 1 of FIG. 1 is a power chip such as an IGBT or a diode chip. The semiconductor element 1 is mounted on a laminated substrate 2 with a bonding layer 10 such as solder interposed therebetween. The laminated substrate 2 is bonded to a metal substrate 3 such as a heat spreader using the bonding layer 10 such as solder. An output terminal 5 fixed by the solder bonding layer 10 is erected on the laminated substrate 2. Here, the output terminal 5 conceptually includes an external connection terminal, an intermediate terminal, and a conductive plate, and is an external connection terminal in the illustrated embodiment. The output terminal 5 and semiconductor element 1 are electrically connected to each other through metal wire 6 being a conductive connection member. A terminal casing 4 is made of thermoplastic resin such as polyphenylene sulfide (PPS). The terminal casing 4 is insert-molded and bonded to the metal substrate 3 in order to fix the output terminal 5. The terminal casing 4 is filled with first sealant 7. Moreover, a second sealant 8 containing the resin composition of the first embodiment is provided to cover the first sealant 7 and forms the outer peripheral portion of the sealant. In the present invention, the outer peripheral portion of the sealant refers to a portion including a surface of the sealant which could be exposed to the atmosphere and/or a surface which is visually recognizable from the outside as a product of a semiconductor device. Hence, in an aspect with a casing, a portion of the sealant in contact with the casing is not the outer peripheral portion. Note that the position of the outer peripheral portion differs depending on the aspect of the device.

Various Si devices, SiC devices, GaN devices, and the like can be used as the semiconductor element 1. Also, these devices may be used in combination. For example, a hybrid module including a Si-IGBT and a SiC-SBD can be used. The number of semiconductor elements 1 mounted is not limited to that in the illustrated form. More than one semiconductor element 1 may be mounted.

The laminated substrate 2 includes an insulating substrate 22, a second conductive plate 21 formed on one surface thereof, and a first conductive plate 23 formed on the opposite surface thereof. A material having an excellent electrical insulation property and thermal conductivity can be used for the insulating substrate 22. Examples of the material for the insulating substrate 22 include $Al_2O_3$, AlN, SiN, and the like. In particular, for a use requiring a high-withstand-voltage insulation, a material having both an electrical insulation property and thermal conductivity is preferable, and AlN and SiN meet these requirements. However, the material is not limited to the above. Metal materials such as Cu and Al having excellent processability can be used as the second conductive plate 21 and the first conductive plate 23. Also, it is possible to use Cu or Al subjected to Ni plating or the like in order to inhibit corrosion. A method of providing the conductive plates 21 and 23 on the insulating substrate 22 includes a direct copper bonding method and an active metal brazing method. It suffices that the metal wire being the conductive connection member 6 has conductivity, and Al or Cu wire can be used typically. The metal substrate 3 may be, for example, a Cu plate or an Al plate, which are advantageous as a heat emitter. Another heat-emitting structure may be provided instead of the metal substrate 3.

The second sealant 8 is a sealant which has excellent oxidation resistance containing the resin composition of the first embodiment. The second sealant 8 forms the outer peripheral portion of the sealant. Since there is provided the terminal casing 4 in the embodiment, an outer peripheral surface which is exposed to contact with the air is a surface at a position opposite to the laminated substrate 2. The second sealant 8 is preferably formed in the shape of a layer with a thickness of 1 to 2 mm from the outer peripheral surface. Oxidation deterioration of the sealant can usually proceed to a depth of 1 mm from a surface (surface in contact with the air) of the sealant. The present inventors confirmed that under the conditions that a thermosetting cured resin product not containing the fluorine resin powder was left for 1000 hours in an atmosphere at 250° C., the region of oxidation deterioration was a little less than 1 mm from the surface, by cross-sectional observation using a scanning electron microscope (SEM) and the color fading property. Meanwhile, it is possible to efficiently inhibit the oxidation of the resin by locating a resin composition containing a fluorine resin powder having low oxygen permeability in an outer peripheral portion which is about 0.5 to 2 mm, or preferably about 0.5 to 1.5 mm from the surface. In the case in which the layer of the second sealant 8 is excessively thick, differences in physical property between the first sealant and the second sealant, such as coefficient of linear expansion, elastic modulus, and the like may cause stress to be applied to an interface.

The first sealant 7 insulation-protects the surface of the laminated substrate 2 and the semiconductor element 1. The first sealant 7 is not particularly limited. As the first sealant 7, the resin composition containing the fluorine resin powder described in detail in the first embodiment may be used, or another ordinary sealant for sealing a semiconductor. For example, it is preferable to use a sealant with a glass transition temperature (Tg) higher than a junction temperature (Tj) of the semiconductor element 1 by 10° C. or more, and it is more preferable to use a sealant with Tg of 200° C. or more. The first sealant 7 may contain a thermosetting base resin with high heat resistance, a curing agent, and an inorganic filler, and may optionally contain a curing accelerator and various additives. The thermosetting base resin with high heat resistance is not particularly limited, but preferably contains an alicyclic epoxy resin and a maleimide resin. More preferably, the thermosetting base resin with high heat resistance may be a mixture of an alicyclic epoxy resin and a bisphenol A epoxy resin. In this case, the alicyclic epoxy resin and the bisphenol A epoxy resin may be mixed at a mass ratio ranging from 1:1 to 1:4. In addition, when the resin composition according to the first embodiment is used as the first sealant 7, the composition thereof may be the same as, or different from, that of the second sealant 8. When the compositions of the first sealant 7 and the second sealant 8 are exactly the same, they form a single continuous sealant, unlike the two-layer sealant in the illustration. Moreover, the aspect of sealing by the first sealant 7 is not limited to that in the illustration. For example, the first sealant 7 may be formed of sealants with different compositions of two or more layers.

Subsequently, a method of manufacturing the semiconductor device according to the embodiment is briefly described. The method of manufacturing the semiconductor device according to the embodiment includes the steps of: mounting the semiconductor element 1 on the laminated substrate 2; connecting the semiconductor element 1 and the output terminal 5 together through the conductive connection member 6; sealing the semiconductor element 1, the output terminal 5, the conductive connection member 6, and the surface of the laminated substrate 2 using the first sealant 7; and sealing the outer peripheral portion using the second sealant 8.

It is possible to mount the semiconductor element 1 on the laminated substrate 2 and to connect the semiconductor element 1 and the output terminal 5 together through the conductive connection member 6 by an ordinary method known in the field of semiconductor devices. In addition to these steps, it is possible to perform a step of attaching necessary members by an ordinary method.

The sealing step by use of the first sealant 7 can be performed by an ordinary method. Although the sealing can be achieved by, for example, potting in the embodiment provided with the casing 4 in the illustration, and transfer molding and the like in an embodiment without a casing, it is not limited to a specific method.

The sealing step by use of the second sealant 8 can be performed by preferably heat-curing the first sealant 7 and thereafter further providing a layer of the second sealant 8 on the outer peripheral portion. In the embodiment provided with the casing in the illustration, it is possible to apply the second sealant 8 on the first sealant 7 by a method which utilizes a dispenser or a spray method. In an embodiment without a casing, it is possible to further provide a layer of the second sealant 8 by a spray method or a dip method in which sealing is performed using the first sealant 7 and the cured module is dipped in the composition matters of the second sealant 8.

When the compositions of the first sealant 7 and the second sealant 8 are exactly the same, the sealing does not need to be performed by separately applying the first sealant 7 and the second sealant 8, but can be performed by a single potting or transfer molding.

It is possible to perform each of the heat-curing steps, that is, the heat-curing of the first sealant 7 and the heat-curing of the second sealant 8, for one to two hours at 100 to 120° C. and thereafter for one to two hours at 175 to 185° C., for example. However, the heat-curing steps are not limited to a particular temperature or time duration, and do not have to be two steps in some cases. Alternatively, it is possible to fill the casing with the first sealant 7 by potting, perform no heating or temporarily cure the first sealant 7 for one to two hours at 100 to 120° C., thereafter apply the second sealant 8, and finally perform heat-curing. In any of the cases, the fluorine resin does not react at the curing temperature of the thermosetting base resin such as an epoxy resin.

In addition, as a modification of the embodiment, the present invention also includes a semiconductor device without a casing, in which the sealant forms the outer peripheral portion except the surface on which the laminated substrate is positioned. In this case, it is preferable that the layers of the second sealant 8 be positioned not only on one surface illustrated in FIG. 1, but also on four surfaces which are substantially perpendicular to this surface. The thickness of each of the layers in that case may be the same as that illustrated in the embodiment depicted in FIG. 1. Since the sealant in the embodiment described above has many portions visually recognizable from the outside, the present invention provides a remarkable color fading inhibition effect in the form of a product.

As still another modification of the semiconductor device according to the present invention, a conductive connection member may be not in the form of metal wire only, but in the form of a lead frame, for example. In a semiconductor device provided with a lead frame structure, the lead frame is bonded on the semiconductor element. The structure of a semiconductor device provided with a lead frame includes one disclosed in, for example, Japanese Patent Application Publication No. 2005-116702 by the present applicants, but is not limited to a particular structure. Also in a semiconductor device provided with a lead frame structure, the form of sealants is such that sealing is performed using the first sealant and the second sealant, as in the case of the form illustrated in FIG. 1. At least the second sealant, which is positioned at the outer peripheral portion of the sealant, contains the resin composition of the first embodiment.

Figure 2:
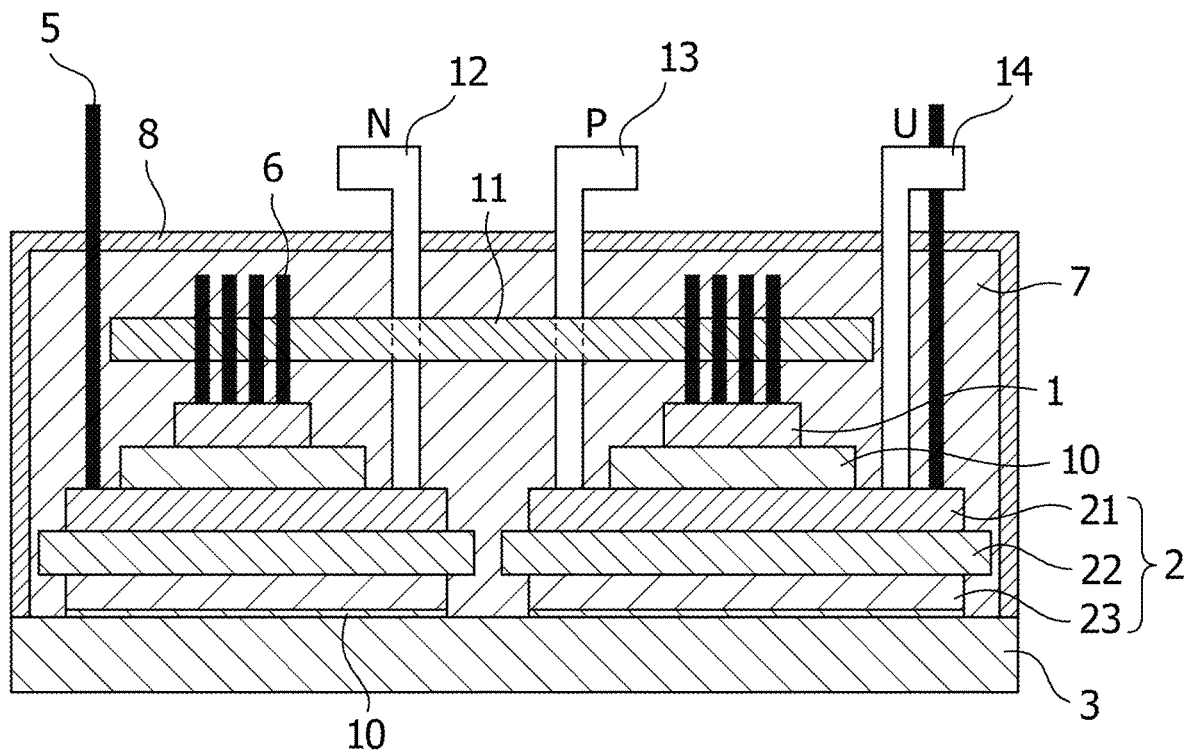
FIG. 2 is a conceptual diagram illustrating a cross-sectional structure of a power module, which is another example of a semiconductor device according to the present invention.

Subsequently, a semiconductor device provided with a pin structure is described. FIG. 2 is a conceptual cross-sectional diagram of a power module provided with the pin structure, which is an example of the semiconductor device according to the present invention. The semiconductor device provided with the pin structure has the semiconductor elements 1 each mounted on the corresponding laminated substrate 2 with the bonding layer 10 interposed therebetween. Multiple implant pins, each of which is a conductive connection member 6, are bonded to electrodes of the semiconductor elements 1 on the opposite side of the laminated substrates 2. Further, a printed circuit board 11 is fixed to the implant pins 6 while being opposed to the semiconductor element 1. One end portion of each of main terminals N12, P13, and U14 is attached to an upper surface of the second conductive plate 21, and another end portion of each main terminal is pulled out to the outside of the module. The control terminal 5 is attached to the upper surface of each of the second conductive plates 21 to enable electrical connection to the outside of the semiconductor module. The first sealant 7 is provided in contact with the semiconductor elements 1, the surfaces of the laminated substrates 2, the implant pins 6, the printed circuit board 11, and the terminals 5, 12, 13, and 14, and insulation-encapsulates these members. Moreover, the second sealant 8 containing the resin composition of the first embodiment is provided to cover the first sealant 7 and forms the outer peripheral portion of the sealant. In the embodiment, there is no casing provided and the second sealant 8 forms the outer peripheral portion while being exposed.

Each of the laminated substrates 2 includes the insulating substrate 22 and the conductive plates 21 and 23 provided on both surfaces thereof. The conductive plates 21 and 23 according to the embodiment are preferably block-shaped with a large thickness. Each of the semiconductor elements 1 according to the embodiment is typically a semiconductor element to which a wide-bandgap semiconductor is applied, and multiple semiconductor elements are mounted. The implant pins 6 electrically connect the semiconductor elements 1 together, or each of the semiconductor elements 1 and the printed circuit board 11 together. Each of the implant pins 6 may be a member made of Cu, and may also be a Cu member subjected to Ni plating process or the like for the purpose of, for example, corrosion inhibition. As the printed circuit board 11, it is possible to use a polyimide film board or an epoxy film board on which a circuit electrode made of Cu, Al, or the like is formed. As in the case of the embodiment illustrated in FIG. 1, the second sealant in the embodiment may have a layer thickness of 1 to 2 mm from the surface, and can be provided substantially uniformly on the overall outer peripheral surface. The first sealant 7 may be the same as that described with reference to FIG. 1 and may be any sealing resin. The first sealant and the second sealant may be formed of the resin composition of the first embodiment, not being separated.

Also in the embodiment, the method of manufacturing the semiconductor device may be substantially the same as that in the embodiment illustrated in FIG. 1. Since there is no casing provided, it is possible to perform sealing by use of the first sealant in a transfer molding method or the like. Sealing by use of the second sealant includes, but is not limited to, transfer molding, compression molding, the dip method, a spray method, and the like.

Note that a semiconductor device provided with the pin structure can be adapted in an embodiment provided with a terminal casing. In that case, the surface opposite to the laminated substrate 2 may be exposed to the outside and this surface may be formed of the second sealant, as in the case of the embodiment illustrated in FIG. 1.

The semiconductor device according to the second embodiment of the present invention makes it possible to enhance the reliability of the semiconductor device by inhibiting peeling and cracks of the sealant through the enhancement of the heat resistance of the sealant and the inhibition of the oxidation deterioration thereof. Additionally, it is possible to improve the color fading property of the sealant and to provide a semiconductor device having a good external appearance. Generally, the fluorine resin is not applicable to a sealant as a resin film because of its low adhesion to thermosetting resins of other types. The present invention successfully prevented the oxidation deterioration of the sealant by mixing the fluorine resin powder with the thermosetting resin to impart the thermosetting resin with gas permeability.

EXAMPLES

Hereinbelow, the present invention is described in further detail using Examples of the present invention. However, the present invention is not limited to the scope of Examples below.

(1) Types of Fluorine Resin Powders and Effects of Amount Added

In each of Examples 1 to 6, a testing device for the power module illustrated in FIG. 1 was fabricated to perform characteristic evaluation. The second sealant was prepared. A mixture of a bisphenol A epoxy resin and an alicyclic epoxy resin at a mass ratio of 3:2 (ME272, manufactured by Pelnox, Ltd.) was used as an epoxy resin for the thermosetting base resin. Cyclohexane-1,2-dicarboxylic anhydride (HV136, manufactured by Pelnox, Ltd.) was used as the curing agent. The combination of the base resin and the curing agent above was used as the basic resin composition. Note that the curing agent was used such that the acid anhydride curing agent was 100 parts by mass relative to 100 parts by mass of the thermosetting base resin. Moreover, fused silica particles (manufactured by Tatsumori Ltd., trade name "ZA-30") with an average particle diameter of 5 μm were used as the inorganic filler. The preparation of the addition amount was made such that the total mass of the inorganic filler was 250 parts by mass when the total mass of the thermosetting base resin and the curing agent was set to 100 parts by mass. The fluorine resin powder, which had been reduced to powder with an average particle diameter of 20 μm, was mixed at ratios to be described later. The amount of fluorine resin powder contained described below is represented in percent by mass of the fluorine resin powder when the total mass of the thermosetting base resin, the curing agent, the inorganic filler, and the fluorine resin powder is regarded as 100%. The second sealant was mixed with a blue pigment in order to color the sealant.

Each of the testing devices was fabricated by assembling the members illustrated in FIG. 1, and performing sealing followed by heat-curing with use of the first sealant prepared with the same composition as that of the second sealant described above, except that the fluorine resin powder was not contained. The second sealant was applied on the outer periphery by a casting method, retained for one hour at 100° C., and thereafter retained for one hour at 180° C. As a result, a layer of the sealant with a thickness of 1 mm was formed on the outer peripheral portion.

(2) Effects of Thickness of Fluorine Resin Powder-Containing Resin Layer of Outer Peripheral Portion of Sealant As in the case of (1) described above, the second sealant having 30% by mass of the fluorine resin powder PVDF blended therein was prepared in Examples 7 to 9. As in the case of (1) described above, the members illustrated in FIG. 1 were assembled, and sealing was performed with use of the first sealant, which was followed by heat-curing.

Subsequently, a sealing layer of the second sealant was formed on the outer peripheral portion. The formation method and the heat-curing conditions were the same as those in (1) described above, but the thickness was varied from 0.2 mm to 2 mm. Meanwhile, the testing device of Comparative Example 1 was fabricated by sealing using only the first sealant, without the second sealant provided. In the testing device of Comparative Example 1, a blue pigment was added to the first sealant for coloring.

Heat Cycle Test

As one of the methods of evaluating heat resistance, a heat cycle test was carried out to evaluate each of the testing devices. Specifically, one heat cycle is defined by a thirty-minute retention at −40° C. followed by a thirty-minute retention at 175° C., which was repeated 500 times. "Good" was defined as a case in which peeling did not occur between the chip and the sealing resin, and "poor" was defined as a case in which peeling occurred between the chip and the sealing resin before 500 cycles were reached. Incidentally, the peeling was checked visually and with use of an optical microscope at a magnification of 500×.

Workability Evaluation

Workability indicates whether or not a resin can flow easily into the terminal casing in the fabrication of the semiconductor device such as the power module. If the resin has a high viscosity, it is difficult for the resin to flow into the terminal casing, leading to an increase in the amount of work. This unfavorably increases the labor for fabricating the package of the semiconductor device. In addition, high viscosity causes an unfavorable situation. For example it becomes difficult to remove bubbles and the surfaces tend to be uneven. For these reasons, the workability was also evaluated in Examples and the Comparative Example. The workability was evaluated based on the viscosity of the resin. For example, the workability was determined to be "good" when the viscosity of the resin at a temperature of 25° C. was 40 Pa·s or less because the workability was good, and the workability was determined to be "poor" when the viscosity of the resin at a temperature of 25° C. exceeded 40 Pa·s because the workability was poor. The viscosity was measured using a Brookfield viscometer based on JIS (Japanese Industrial Standards) Z8803.

Color-Fading Property

After the heat cycle test described above, a color fading property of the sealant on the outer peripheral portion of the testing device was evaluated as an evaluation of heat resistance. In other words, the color fading property of the second sealant containing the fluorine resin powder was evaluated in the Examples, and the color fading property of the sealant not containing the fluorine resin powder was evaluated in the Comparative Example. The color fading property was measured using a chromameter, and was evaluated using an L*a*b* color space prescribed in JIS (Japanese Industrial Standards) Z8781-4:2013. The L*a*b* color space represents colors using three values, namely, an L*-hue indicating brightness, and a*- and b*-chromaticities indicating saturation. Since the fluorine resin powder used in Examples was transparent and the second sealant was colored in blue, the change in color can be represented by the b*-value. In general, a sealant with a range of change of 18 or more relative to the initial value can be determined as poor. Specifically, in each of the tests, a sealant with a b*-value of −15 or greater after the heat cycle test was determined to be "poor" whereas the initial b*-value of the second sealant before the heat cycle test was −33. A two millimeter square test piece for the evaluation was cut out from the sealant on the outer peripheral portion of each of the testing devices. Note that the testing benchmark, where the range of change is set to 18 or more, is applied to specific forms of Examples and is not intended to limit the present invention.

Evaluation Results

Table 1 shows evaluation results of Examples 1 to 6. An oxidation state of the outer peripheral portion was suppressed by using a second sealing layer, compared with the case where only the first sealant was provided without providing the second sealing layer. This can be determined by frequency of the peeling between the chip and the sealing resin due to the heat cycle test. However, an effect of suppressing color fading was insufficient when the amount of fluorine resin powder added was 1% by mass or less. On the other hand, when the amount added was 60% by mass or more, the viscosity increased and the workability deteriorated.

TABLE 1

|  | Example 1 | Example 2 | Example 3 | Example 4 | Example 5 | Example 6 |
|---|---|---|---|---|---|---|
| Fluorine resin | PVDF | CPT | PCTFE | PVDF | PVDF | PVDF |
| Concentration of fluorine resin (% by mass) | 30 | 30 | 30 | 5 | 1 | 50 |
| Heat cycle test | good | good | good | good | good | good |
| Workability | good | good | good | good | good | good |
| Color fading property | good | good | good | good | poor | good |

Table 2 shows evaluation results of Examples 1 and 7 to 9, and the comparative example. Note that although Example 1 is listed in both Tables 1 and 2 for convenience of display, both of the entries are based on the test results obtained from the same testing device. Color fading did not proceed in Examples 1 and 7 to 9 and good results were obtained. On the other hand, apparent color fading was observed in the case of Comparative Example 1.

TABLE 2

|  | Thickness of second sealing layer | Color fading property |
|---|---|---|
| Example 7 | 0.2 mm | good |
| Example 8 | 0.5 mm | good |
| Example 1 | 1 mm | good |
| Example 9 | 2 mm | good |
| Comparative Example 1 | 0 mm | poor |

While there is no intention of being bound by theory, it is considered that the second sealant constituting the devices of Examples has a phase-separated structure because the fluorine resin powder with low gas permeability (including oxygen) is mixed in an epoxy resin (in the liquid state) and cured at the curing temperature (low curing temperature) of the epoxy. The second sealant hinders the permeation of oxygen of the external environment, inhibiting the oxidation of the sealant. It is considered that deterioration of the resin (such as coloring) can be suppressed as a result.

REFERENCE SYMBOLS LIST 1 semiconductor element
2 laminated substrate 21 second conductive plate
22 insulating substrate
23 first conductive plate
3 heat spreader
4 casing
5 output terminal
6 conductive connection member
7 first sealant
8 second sealant
10 bonding layer
11 printed circuit board
12 main terminal N
13 main terminal P
14 main terminal U

The invention claimed is:

1. A semiconductor device, comprising:
   a semiconductor element;
   an output terminal;
   a laminated substrate, wherein the semiconductor element and the output terminal are mounted on the laminated substrate;
   a conductive connection member, wherein the semiconductor element and the output terminal are connected together using the conductive connection member;
   a first sealant contacting the semiconductor element, the output terminal and the conductive connection member; and
   a layer of a second sealant disposed on an outer peripheral portion of the first sealant, the layer of the second sealant is not in contact with the semiconductor element, wherein the first sealant is different from the second sealant, and the second sealant contains a resin composition;
   wherein the resin composition comprises:
      a thermosetting base resin;
      a curing agent;
      an inorganic filler; and
      at least one fluorine resin powder selected from polyvinylidene fluoride, polychlorotrifluoroethylene, and a tetrafluoroethylene/perfluoro(alkyl vinyl ether)/chlorotrifluoroethylene copolymer,
      wherein a content of the fluorine resin powder is more than 1% by mass and less than 50% by mass when a total mass of the thermosetting base resin, the curing agent, the inorganic filler, and the fluorine resin powder is regarded as 100%, and
      wherein an average particle diameter of the fluorine resin powder ranges from 10 to 200 μm.

2. The semiconductor device according to claim 1, wherein a thickness of the layer of the second sealant is 1.0 to 2.0 mm.

3. The semiconductor device according to claim 1, wherein the thermosetting base resin is a mixture of an alicyclic epoxy resin and a bisphenol A epoxy resin.

4. The semiconductor device according to claim 1, wherein the conductive connection member includes any of a wire, a pin, and a lead frame.

5. The semiconductor device according to claim 1, wherein the semiconductor element includes any of a Si semiconductor element, a SiC semiconductor element, and a GaN semiconductor element.

6. The semiconductor device according to claim 1,
   wherein, an amount of the curing agent is 50 to 170 parts by mass relative to 100 parts by mass of the thermosetting base resin; and
   an amount of the inorganic filler added is 100 to 600 parts by mass when the total mass of the thermosetting base resin and the curing agent is set to 100 parts by mass.

7. The semiconductor device according to claim 1, further comprising:
   a metal substrate, wherein the laminated substrate is bonded to the metal substrate; and
   a terminal casing bonded to the metal substrate, wherein the first sealant is filled in the terminal casing.

8. The semiconductor device according to claim 1, wherein the laminated substrate further comprises:
   an insulating plate;
   a first conductive plate; and
   a second conductive plate,
   wherein the insulating plate is disposed between the first and second conductive plates, and
   wherein the semiconductor element and the output terminal are mounted on the first conductive plate.

9. The semiconductor device according to claim 1, wherein the output terminal extends through the layer of second sealant.

* * * * *